United States Patent
Weisser et al.

(10) Patent No.: US 12,320,855 B2
(45) Date of Patent: Jun. 3, 2025

(54) METHOD FOR ASCERTAINING A STATE OF CHARGE OF AN ENERGY STORAGE UNIT AND/OR A PROBABLE REMAINING OPERATING TIME OF A MEASURING DEVICE, AND MEASURING DEVICE

(71) Applicant: Diehl Metering GmbH, Ansbach (DE)

(72) Inventors: Armin Weisser, Unterkirnach (DE); Christian Bär, Schwabach (DE); Steffen Ritter, Bechhofen (DE)

(73) Assignee: Diehl Metering GmbH, Ansbach (DE)

( * ) Notice: Subject to any disclaimer, the term of this patent is extended or adjusted under 35 U.S.C. 154(b) by 120 days.

(21) Appl. No.: 18/318,085

(22) Filed: May 16, 2023

(65) Prior Publication Data

US 2023/0366941 A1    Nov. 16, 2023

(30) Foreign Application Priority Data

May 16, 2022    (DE) .................... 10 2022 112 238.7

(51) Int. Cl.
  *G01R 31/374*    (2019.01)
  *G01F 1/667*     (2022.01)
  *G01R 31/3842*   (2019.01)

(52) U.S. Cl.
  CPC .......... *G01R 31/374* (2019.01); *G01F 1/667* (2013.01); *G01R 31/3842* (2019.01)

(58) Field of Classification Search
  None
  See application file for complete search history.

(56) References Cited

U.S. PATENT DOCUMENTS

| | | | | |
|---|---|---|---|---|
| 4,725,784 A | * | 2/1988 | Peled | G01R 31/3648 340/636.15 |
| 5,652,069 A | * | 7/1997 | Sakai | G01R 31/3648 320/136 |
| 2013/0241564 A1 | * | 9/2013 | Krieg | G01R 31/382 324/426 |
| 2014/0139189 A1 | * | 5/2014 | Izumi | H02J 7/0048 320/134 |
| 2015/0301115 A1 | * | 10/2015 | Ohkawa | G01R 31/388 324/426 |
| 2016/0049821 A1 | * | 2/2016 | Aridome | H02J 7/0071 320/128 |
| 2020/0249704 A1 | * | 8/2020 | Savini | G05D 7/0635 |
| 2022/0055500 A1 | * | 2/2022 | Feldman | G01C 21/3407 |
| 2023/0123869 A1 | * | 4/2023 | Martinez | G01R 31/3648 702/64 |

* cited by examiner

*Primary Examiner* — Jas A Sanghera
(74) *Attorney, Agent, or Firm* — Laurence A. Greenberg; Werner H. Stemer; Ralph E. Locher

(57) ABSTRACT

A method for ascertaining a state of charge of an energy storage unit of a measuring device and/or a probable remaining operating time of the measuring device, includes capturing a plurality of voltage measured values for the voltage dropped across the energy storage unit and a plurality of current measured values for the current provided by the energy storage unit within a respective ascertainment interval. Subsequently, the state of charge associated with the respective ascertainment interval and/or the remaining running time associated with the ascertainment interval are ascertained in each case depending on the plurality of voltage measured values and current measured values. A measuring device for capturing a measured variable is also provided.

12 Claims, 4 Drawing Sheets

METHOD FOR ASCERTAINING A STATE OF CHARGE OF AN ENERGY STORAGE UNIT AND/OR A PROBABLE REMAINING OPERATING TIME OF A MEASURING DEVICE, AND MEASURING DEVICE

CROSS-REFERENCE TO RELATED APPLICATION

This application claims the priority, under 35 U.S.C. § 119, of German Patent Application DE 10 2022 112 238.7, filed May 16, 2020; the prior application is herewith incorporated by reference in its entirety.

FIELD AND BACKGROUND OF THE INVENTION

The invention relates to a method for ascertaining a state of charge of an energy storage unit of a measuring device and/or a probable remaining operating time of the measuring device. The invention also relates to a measuring device.

In measuring devices used in the field, for example consumption meters such as water meters, heat meters or cold meters, power is often supplied by batteries that are not charged in the field and are therefore drained continuously over a relatively long time. Since replacing batteries of such meters can cause considerable labor costs, corresponding batteries are generally dimensioned so as to be large enough that they function reliably over an operating interval or calibration interval of the meter, after which it is necessary to replace or recalibrate the measuring device in any case, and therefore it is possible to replace the battery at the same time in that case. Since, however, due to different regulations in different countries, calibration intervals can be of different lengths and the consumption of the measuring device can additionally depend on ambient conditions, for example the ambient temperature, that approach results in the battery being over-dimensioned for most application situations.

It can therefore be expedient to monitor the state of charge of the battery of a measuring device in order to allow, for example, an unscheduled replacement of a measuring device or battery, or an adjustment to the measuring device operation in the event of a low state of charge. In consumption meters, in particular in smart meters, the state of charge is typically ascertained by Coulomb counting or current integration. That does achieve accuracies that are generally sufficient for rechargeable accumulators or conventional lithium cells. However, ascertaining the state of charge by Coulomb counting is rather inaccurate and prone to error for lithium-thionyl chloride batteries, for example, which are particularly suitable for slow discharging over long operating times as typically occurs in consumption meters.

SUMMARY OF THE INVENTION

It is accordingly an object of the invention to provide an improved approach for ascertaining the state of charge of an energy storage unit of a measuring device and for predicting a probable remaining operating time of the measuring device, as well as an improved measuring device, which overcome the hereinafore-mentioned disadvantages of the heretofore-known methods and devices of this general type and in which the approach should be suitable in particular for monitoring lithium-thionyl chloride batteries or generally batteries for supplying power to measuring devices with relatively low energy consumption over long periods of time.

With the foregoing and other objects in view there is provided, in accordance with the invention, a method for ascertaining a state of charge of an energy storage unit of a measuring device and/or a probable remaining operating time of the measuring device, wherein a plurality of voltage measured values for the voltage dropped across the energy storage unit and a plurality of current measured values for the current provided by the energy storage unit are captured within a respective ascertainment interval, after which the state of charge associated with the respective ascertainment interval and/or the remaining running time associated with the ascertainment interval are ascertained in each case depending on the plurality of voltage measured values and current measured values.

Within the context of the invention, it has been recognized that the current characteristic and voltage characteristic, during normal operation of a measuring device, in particular in certain states of charge, for example during propagation time measurements in flow meters or certain properties of the respective characteristic, have a clear dependence on the state of charge and therefore, in known operating patterns of the measuring device, on the probable remaining running time of the measuring device. Therefore, taking into consideration both types of measured value and the use of in each case a plurality of measured values, even when using an energy storage unit that is particularly suitable for a slow discharge, i.e. in particular has a low self discharge, makes it possible to achieve a considerably better level of accuracy and robustness than would be possible, for example, using Coulomb counting to determine a state of charge.

In particular, in the case of Coulomb counting, currents are integrated over very long operating intervals, with the result that even small errors in the measured currents, in particular in the case of a slow discharge of the energy storage unit, can lead to considerable errors in the ascertained state of charge. As will be explained in more detail later, in the method according to the invention, relatively short ascertainment intervals of, for example, only a few seconds or even of less that one second can be used and current integration can be dispensed with, with the result that the error source mentioned can be avoided.

It has been additionally recognized that, in the method according to the invention, in contrast to the evaluation of an open-circuit voltage of the energy storage unit, which changes significantly shortly before the energy storage unit is drained completely, it is possible to achieve a good level of accuracy and robustness when ascertaining the state of charge or the remaining operating time over a wide range of states of charge, with the result that suitable measures, for example an unscheduled replacement of the energy storage unit or an adjustment to the operating strategy, can be implemented in good time before the energy storage unit is substantially drained.

Preferably, the temperature of at least one component of the measuring device, in particular of the energy storage unit, is captured, wherein the ascertainment of the state of charge and/or the remaining running time additionally depends on this temperature. In addition to the state of charge, the temperature of the energy storage unit is a further relevant influencing factor for the behavior of the energy storage unit under load, since it affects the internal resistance of the energy storage unit, for example. Taking the temperature into consideration makes it possible to largely separate the influences of temperature and state of charge or state of health of the energy storage unit, as a result of which the accuracy of the ascertainment of the state of charge or of the remaining operating time can be further improved.

It is possible that, with respect to the respective ascertainment interval, only an individual temperature value or few temperature values are ascertained, which, for example, can be ascertained before, during and/or following the respective ascertainment interval. A larger number of temperature values can also be taken into consideration, however, wherein in particular a median or mean of these temperature values can be processed further. By way of example, one temperature value can be ascertained for each current or voltage measured value.

Instead of taking a median or mean into consideration, or in addition thereto, in this case the influence of the respective temperature value on the individual current or voltage value can be taken into consideration before the further processing of the current or voltage values.

By way of example, the temperature of the energy storage unit can be measured directly by a temperature sensor in or on the energy storage unit. It can also be advantageous, however, to measure the temperature of a component, in particular a component adjacent to the energy storage unit, of the measuring device using a suitable temperature sensor.

In the method according to the invention, the current or voltage profile over the entire ascertainment interval can be captured by current and voltage measured values being captured periodically during the ascertainment interval, for example. In order to ascertain the state of charge or the remaining running time, all the ascertained current or voltage measured values of the current or voltage characteristic can be taken into consideration, that is to say, for example, several tens or several hundreds or even several thousands of measured values.

As will be explained later, it can be advantageous to parameterize the algorithm for ascertaining the state of charge or the remaining operating time by machine learning, wherein the algorithm used can be a neural network, for example. If such a neural network is intended to directly process a large amount of measured values, a large number of input nodes, and therefore a high level of complexity of the neural network, are required. If the processing is intended to be carried out in a resource-saving manner, for example in order to enable the method explained to be implemented on a microcontroller that is already present in conventional consumption meters, or if robust training is intended to be possible with just a relatively small amount of training data, it is, however, advantageous to reduce the complexity of an algorithm trained by machine learning, i.e. of a neural network. It can therefore be advantageous to first of all extract a few characteristic properties from the current or voltage measured values or the current or voltage characteristic ascertained and to only process these extracted properties as input variables by using an algorithm trained by machine learning. Examples of corresponding properties or input variables are explained in more detail below:

A current maximum value can be selected or ascertained from the current measured values captured during the respective ascertainment interval, wherein the state of charge and/or the remaining running time is/are ascertained depending on the current maximum value. If a load having a known impedance that is not too great is energized during the ascertainment interval, the current maximum value changes with the internal impedance of the energy storage unit. In this case, a relatively low state of charge or a relatively low state of health of the energy storage unit, and therefore a reduced remaining operating time, leads to a relatively high internal impedance and therefore to a relatively low current maximum value, whereby the current maximum value is a good measure of the degree of discharge or ageing of the energy storage unit. The same applies if the consumption of a particular load temporarily increases to a considerable extent for a particular function, for example if a communication device of the measuring device is used for a radio transmission.

If the current measured values are ascertained sufficiently frequently during the ascertainment interval, it can be adequate to select the greatest current measured value as the current maximum value. In contrast, at a rather low sampling rate, it can be advantageous, for example by way of a fit or an interpolation of the measured current measured values, to estimate an actual characteristic of the current intensity, on the basis of which the current maximum value can be ascertained.

Additionally or alternatively to evaluating the current maximum value, a width of a current maximum can be ascertained as a time interval between a current limit value being exceeded and the current limit value, or a further current limit value, being fallen below from the current measured values captured during the respective ascertainment interval, wherein the state of charge and/or the remaining running time is/are ascertained depending on the width of the current maximum. The current limit value or the current limit values can be predetermined in absolute terms, or else depending on the current maximum value, for example, as a percentage of the current maximum value. A relatively low state of charge or a relatively short remaining running time can be identified, for example, due to a broadening of the current maximum.

A measure of the variance of the voltage measured values captured during the respective ascertainment interval or a subinterval of the respective ascertainment interval can be ascertained, wherein the state of charge and/or the remaining running time is/are ascertained depending on the measure of the variance. In particular, the subinterval can be selected in such a way that a particular load is energized or a radio transmission is carried out by way of the communication device during the subinterval, whereby in this case a measure of the variance of the voltage measured values is ascertained under load.

The measure of the variance can directly describe the variance or, for example, also the standard deviation. It has been recognized that the voltage noise, in particular under load, and therefore the variance or standard deviation of the voltage measured values, increases as the discharge or ageing of the energy storage unit increases, whereby the measure of the variance is a good measure of the discharge or ageing.

It is possible for a particular load, in particular an ultrasonic transducer, of the measuring device to be energized and/or a radio transmission to be carried out by way of a communication device of the measuring device at least or exclusively during a subinterval of the ascertainment interval. In particular if the load has a rather low impedance, it is consequently possible, within the ascertainment interval, to observe different effects during operation of the load or the transient behavior upon connection and disconnection of the load and to take these into consideration when ascertaining the state of charge or the remaining operating time. The communication device can be energized exclusively for radio transmission or the radio transmission can lead to a considerable increase in the power consumption of the communication device, whereby what has been stated above for the energization of the load also applies to the radio transmission.

At least one of the voltage measured values can be captured during a measurement interval within the capture interval that starts and ends at a respective fixedly predetermined time following the end of the energization of the particular load or the end of the radio transmission, wherein the state of charge and/or the remaining running time is/are ascertained in particular depending on the mean or the median of the voltage values captured in the measurement interval. In particular when using a load with relatively low impedance, the voltage at the energy storage unit is under some circumstances considerably reduced during the energization of the load, wherein the voltage does not immediately return to the open-circuit voltage at the end of the energization, but rather the voltage regeneration takes a certain amount of time that depends on the state of charge of the energy storage unit. A similar situation applies in the case of the additional loading of the energy storage unit due to a radio transmission. Evaluating the at least one voltage measured value within the fixedly predetermined measurement interval makes it possible to ascertain, with little outlay, whether the voltage level has already regenerated to the original level in the measurement interval, or to what extent this regeneration has already progressed. The voltage measured values in the measurement interval therefore form a good measure of how quickly the voltage regeneration of the energy storage unit takes place and therefore of the state of charge of the energy storage unit or the remaining operating time of the measuring device.

While it would, in principle, be possible to capture and evaluate only exactly one voltage measured value in the measurement interval, for example directly at the start of the measurement interval, the accuracy can be improved further by measuring a plurality of voltage measured values in the measurement interval and subsequently taking the mean or the median into consideration.

At least one of the voltage measured values can be captured during a further measurement interval within the capture interval that starts and ends at a respective fixedly predetermined time before the start of the energization of the particular load or before the start of the radio transmission, wherein the state of charge and/or the remaining running time is/are ascertained in particular depending on the mean or the median of the voltage measured values captured in the further measurement interval. A reference voltage level is provided by the voltage measured value in the further measurement interval or by the mean or the median of the voltage measured values in the further measurement interval, with which reference voltage level the voltage level that was determined for the measurement interval can be compared. By way of example, the state of charge or the remaining operating time can then be ascertained depending on the difference or the quotient between the voltage level in the measurement interval and the voltage level in the further measurement interval.

The voltage regeneration can additionally or alternatively also be evaluated in such a way that a check is performed to ascertain the time at which or the measurement interval in which, following the end of the energization of the particular load or the end of the radio transmission, the voltage level and therefore the voltage measured value or the mean or the median of the voltage measured values in the measurement interval return to a predetermined voltage level or the voltage level ascertained for the further measurement interval or a voltage level predetermined depending on this voltage level. However, this procedure is generally more computationally complex and can therefore increase the complexity of a processing device required and/or the energy consumption for carrying out the method, with the result that the procedure explained above is generally advantageous.

Depending on a plurality of the current measured values that are captured following the start of the energization of the particular load or the start of the radio transmission, a parameter of a current/time characteristic described by these current measured values can be ascertained, wherein the state of charge and/or the remaining running time is/are ascertained depending on this parameter. It has been recognized that noticeably different current intensity characteristics result in the case of different states of charge of the energy storage unit directly following the start of the energization of a load or following the start of the radio transmission. In this case, in particular due to a capacity of the load or the communication device, specifically largely independently of the state of charge, it is possible to supply the same amount of current overall to the load or the communication device, in such a way that, for example, the integral over the current characteristic is at least approximately equal following the start of the energization. However, it has been recognized that relatively low currents tend to be provided over relatively long periods in the case of low states of charge, whereas relatively high peak current flows arise in the case of relatively high states of charge, it being possible for these to decay again even after a relatively short period, however.

By way of example, the mean or the median of those current measured values that are captured within a particular time window, which is spaced apart from the start of the energization of the load or the start of the radio transmission by a certain time interval, can therefore be used as a parameter of the current/time characteristic. If currents that are still relatively high are measured in such a time window, this indicates a slow decay of the current supplied to the load or to the communication device, and therefore tends to indicate a relatively low state of charge of the energy storage unit.

Alternatively or additionally, a time, following which the current measured value falls below a predetermined limit value after switch-on, could also be ascertained as a parameter of the current/time characteristic.

Additionally or alternatively, a gradient or curvature of the current/time characteristic, for example, could also be ascertained as a parameter of the current/time characteristic, for example by a curve of best fit being initially fitted to the current measured values or the like.

The more measured variables, or parameters determined therefrom, are processed by using an algorithm to determine the state of charge or the remaining operating time as input variables, the more accurately and robustly these variables can generally be determined; however, at the same time, this also leads to an increase in the processing complexity and therefore in the energy consumption, for example. In this case, in preliminary tests, the use of five input variables that are ascertained from the plurality of current and voltage measured values has been found to be a good compromise between processing complexity and accuracy and robustness of the ascertainment. In particular, these can be the current maximum value described above, the measure of the variance described above, the voltage level in the measurement interval, or the quotient or the difference between this voltage level and the voltage level in the further measurement interval, the parameter of the current/time characteristic and the temperature. However, in some cases it can also be advantageous not to take one or more of these input variables into consideration and/or to take further input variables into consideration.

The state of charge and/or remaining running time can be ascertained by using an algorithm with a plurality of parameters that are, or have been, predetermined by machine learning on the basis of reference data. The algorithm can in particular process the input variables mentioned above. By way of example, the algorithm can be implemented as a neural network, wherein the parameters can specify input weights of individual neurons, for example. Alternatively, however, parameters of a calculation formula can also be determined by machine learning, for example by using regression analysis.

By way of example, the state of charge or the remaining running time can be identified with a high level of accuracy by monitoring the open-circuit voltage shortly before the end of the remaining running time or when the energy storage unit is substantially empty. If the current measured values and voltage measured values have each already been captured or the above-mentioned input variables for ascertaining the state of charge or the remaining running time have already been ascertained previously for a plurality of temporally spaced-apart ascertainment intervals, it is possible to ascertain an actual state of charge for these ascertainment intervals retrospectively by estimating the current consumption up to the time at which the state of charge can be identified by monitoring the open-circuit voltage, for example. Additionally or alternatively, the temporal spacing of the respective ascertainment interval from the easily identifiable actual end of the remaining running time specifies the remaining running time actually left at the time of the ascertainment interval.

There are therefore training datasets or reference data that in each case describe the current measured values and voltage measured values present for an ascertainment interval, or the input variables ascertained therefrom, and a state of charge or a remaining running time. Conventional approaches for supervised learning can therefore be used to train the algorithm. Approaches for supervised training of an algorithm by machine learning are well known in the prior art and shall therefore not be discussed in detail.

The ascertainment interval can be shorter than ten seconds or shorter than five seconds or even shorter than one second. Additionally or alternatively, exactly one determination of a measured variable, in particular a flow rate determination, can be carried out within the ascertainment interval, and/or the spacing between two ascertainment intervals can be at least double the length of the respective ascertainment interval. In contrast to determining the charge by Coulomb counting, in the case of which substantially the entire operation of the measuring device has to be monitored from the start of the discharging of the energy storage unit, the method according to the invention makes it possible to ascertain the remaining operating time or the state of charge with a high level of accuracy just by monitoring a relatively short ascertainment interval. The method can therefore be carried out at any desired times during the normal operation of the measuring device and does not require any previous knowledge of past operating states. In addition, ascertaining the state of charge or the remaining running time using the method according to the invention in particular requires no information relating to further components of the measuring device that are not energized in the ascertainment interval, for example communication interfaces during exclusive measurement operation in the ascertainment interval or ultrasonic transducers if a consumption of a radio communication device is being evaluated, or relating to the parameterization of the measuring device, i.e. for example, relating to the measuring or communication frequency.

A notification device of the measuring device can be actuated to output a notification to a user and/or to a device external to the measuring device upon a trigger condition, which depends on the state of charge and/or the remaining running time, being met. By way of example, an illuminant can be actuated to emit light or flash so as to notify a user of a necessary battery change. Additionally or alternatively, a corresponding symbol can be shown in a display of the measuring device as a notification, for example, and/or there can be an acoustic notification via a loudspeaker. By way of example, a notification can be sent to a device that is external to the measuring device by radio, via an infrared interface or else by wire, e.g. via an M-bus, in order, for example, to notify a supplier or measurement service provider that it is necessary to change the measuring device or the energy storage unit thereof.

Additionally or alternatively, a parameter that influences the future operation of the measuring device can be changed upon the trigger condition being met. By way of example, the frequency of the measurement by the measuring device, for example the frequency of flow determination, can be reduced once the trigger condition has been met so as to reduce the energy consumption and to therefore increase the remaining running time left at a given state of charge.

The trigger condition can in particular compare the state of charge or the remaining running time or a mean or median of a predetermined number of the most recently ascertained states of charge or remaining running times with a limit value. In particular, the limit value can be selected in such a way that it corresponds to the probable running time until the next calibration or until the next measuring device replacement, or to a probable energy consumption until this time.

Additionally or alternatively to a notification being output upon the trigger condition being met, information relating to the remaining running time or the state of charge can also be output on a display of the measuring device and/or via another user interface, or provided via a remote reading interface, continuously or in response to a particular operating action.

With the objects of the invention in view, there is concomitantly provided a measuring device for capturing a measured variable that in particular relates to a fluid received in a measurement volume or guided through the measurement volume and/or to the flow thereof, wherein the measuring device comprises a processing device and an energy storage unit, and the processing device is configured to ascertain the state of charge of an energy storage unit and/or a probable remaining operating time of the measuring device according to the method of the invention.

The measuring device can in particular include a current sensor for capturing the current measured values that relate to the current provided by the energy storage unit, and/or a voltage sensor for capturing the voltage measured values that relate to the voltage dropped across the energy storage unit. If the measuring device serves to measure the flow, it can therefore include two ultrasonic transducers, for example, which are actuated by the processing device, in particular via associated driver circuits. The use of ultrasonic transducers for directly or indirectly coupling pressure waves into the fluid and a determination of flow rates on the basis of propagation time measurements are well known per se from the prior art and shall therefore not be explained in detail.

The processing device can be configured to capture and process the current or voltage measured values via the respective sensor. This has already been explained in more detail above with reference to the method according to the invention. The processing device can in particular be a microcontroller or an FPGA that is configured to control the measurement, in particular to actuate the ultrasonic transducers and to capture measured values via these. If the processing device also serves to control the measurement, the time of the start and of the end of the energization of the ultrasonic transducers and/or of other components is known, for example, with the result that the above-described measurement times or time intervals can be selected in a suitable manner without any problems. If the measurement is controlled by a control device that is separate from the processing device, corresponding timing information can be provided from the control device to the processing device.

Other features which are considered as characteristic for the invention are set forth in the appended claims.

Although the invention is illustrated and described herein as embodied in a method for ascertaining a state of charge of an energy storage unit and/or a probable remaining operating time of a measuring device, and a measuring device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
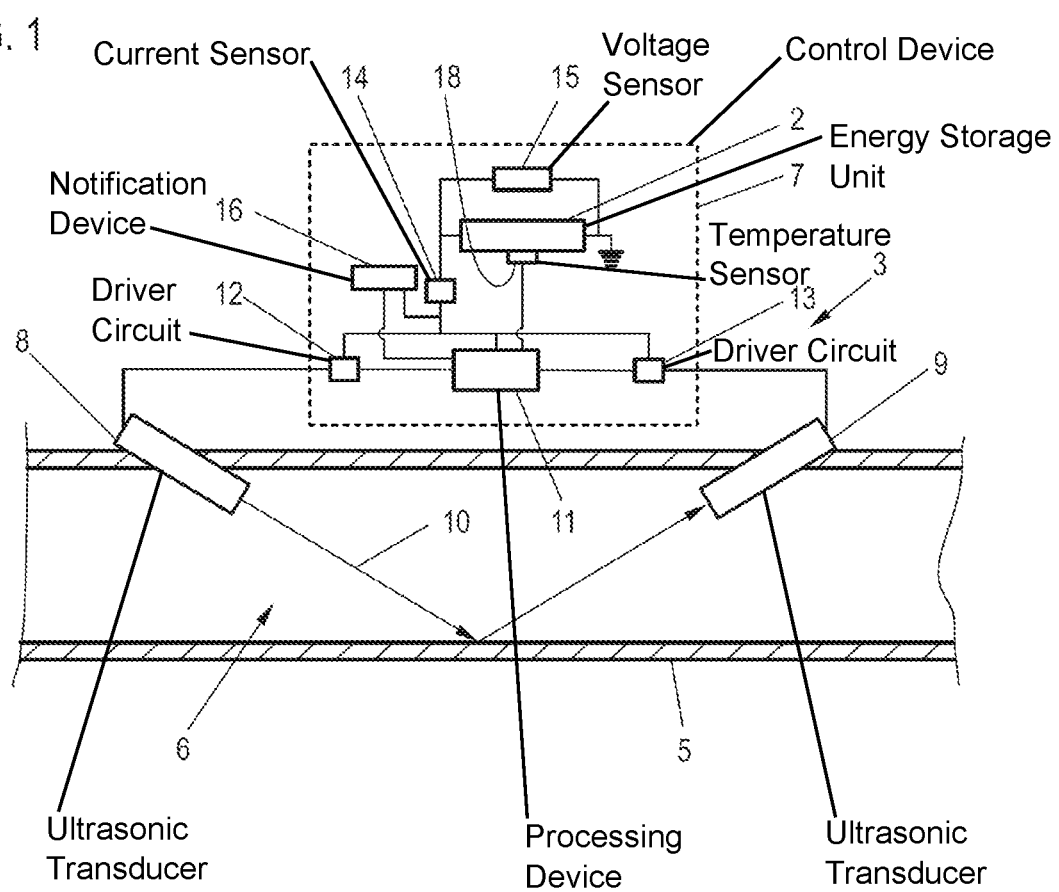
FIG. 1 is a block diagram of a control device with a fragmentary, longitudinal-sectional view of a measuring tube, in an exemplary embodiment of a measuring device according to the invention.

Referring now to the figures of the drawings in detail and first, particularly, to FIG. 1 thereof, there is seen a measuring device 3 that serves to capture a measured variable. In the example, the measuring device 3 is a flow meter that measures a flow of a fluid through a measuring tube 5 or a measurement volume 6 limited thereby as a measured variable. This makes use of the fact, as is well known per se, that a propagation time of an ultrasonic wave 10, which is excited in the fluid by an ultrasonic transducer 8, to an ultrasonic transducer 9, differs from a propagation time in the opposite direction by a propagation time difference, wherein the propagation time difference depends on the rate of flow and therefore on the flow volume. A flow measurement of this kind is well known per se and shall not be explained in detail.

The measuring device is supplied with energy by an energy storage unit 2 that in particular is a lithium-thionyl chloride battery, that is to say is a non-rechargeable battery with a long service life. The energy storage unit 2 can be integrated in a housing or the like with further components of a control device 7, wherein the control device 7 includes, in addition to a processing device 11 and the energy storage unit 2, further components to be energized, for example driver circuits 12, 13 for the ultrasonic transducers 8, 9 and a notification device 16, for example a display.

In order to be able to predict a remaining service life or a state of charge of the energy storage unit 2, current measured values 20 for currents provided by the energy storage unit 2 are captured by a current sensor 14 and voltage measured values 19 for voltages dropped across the energy storage unit 2 are captured by a voltage sensor 15. Preferably, the temperature of the energy storage unit 2 or of components adjacent thereto is additionally captured by a temperature sensor 18.

One possible configuration of the method, implemented by the processing device 11, for ascertaining the state of charge 1 of the energy storage unit 2 depending on the variables mentioned, is explained in more detail below with additional reference to the flow diagram shown in FIG. 2. It is important in this case that both voltage measured values 19 and current measured values 20 and optionally captured temperatures 21 are processed that have been captured during a particular ascertainment interval 4 that in particular can be very short, i.e., for example only ten seconds or five seconds long or even shorter than one second, after which the state of charge 1 or a remaining operating time, in particular depending on the state of charge 1 and a known probable energy consumption, of the measuring device 3, is estimated on the basis of these data.

While it is therefore necessary to monitor the operation of the measuring device 3 substantially over its entire operating time in conventional approaches for determining a state of charge or a remaining operating time, for example during Coulomb counting, in the explained method, it is sufficient to take into consideration values captured exclusively during a determined ascertainment interval and it is not necessary to take into consideration information about the state of the measuring device 3 before the start of the ascertainment interval 4.

Figure 2:
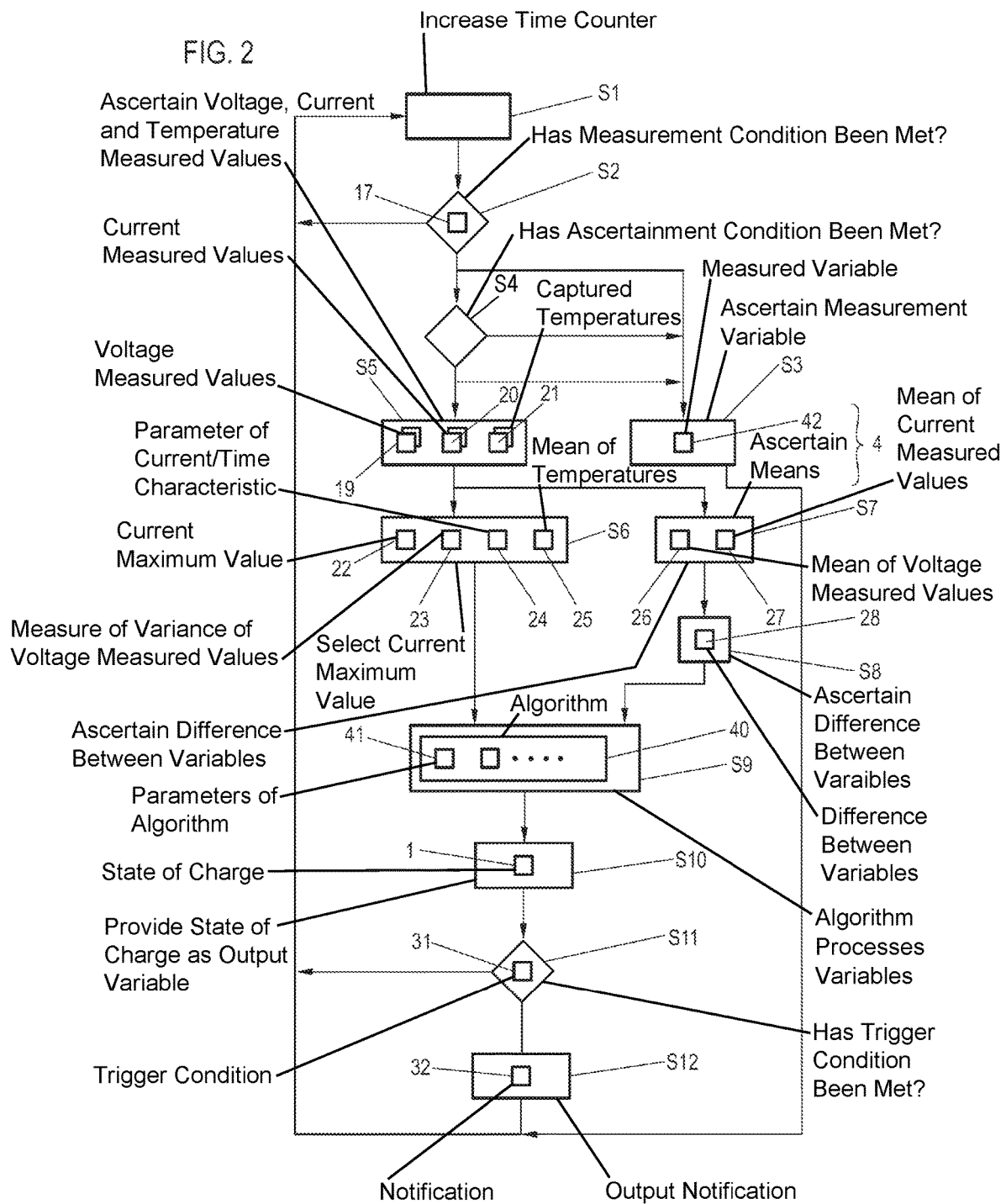
FIG. 2 is a flow diagram of an exemplary embodiment of the method according to the invention.

As is explained in even more detail below, in this case the ascertainment interval 4 in the exemplary embodiment according to FIG. 2 is selected in such a way that only one measured variable 42 is ascertained or the measured values on which this measured variable are based are determined within the ascertainment interval. In this case, in particular the effects of the energization of the ultrasonic transducers 8, 9 on the voltage measured values 19 and the current measured values 20 are evaluated.

Alternatively, it would be possible, for example, for the ascertainment interval to be selected in such a way that a radio transmission is carried out by way of a communication device of the measuring device within the ascertainment interval, wherein the effect of the current consumption, which is caused or increased as a result, on the voltage measured values 19 and the current measured values 20 is evaluated. In general, the ascertainment interval can also be selected in such a way that a noticeably increased current consumption occurs temporarily within the ascertainment interval, whereby an ascertainment interval, within which a temperature measurement is intended to take place, can also be used, for example.

In step S1 of the exemplary embodiment according to FIG. 2, a time counter is first of all increased, which captures the time elapsed since a previous measurement of the measured variable 42.

In step S2, a check is then performed to ascertain whether a measurement condition has been met, in particular whether the time counter exceeds a limit value. If this is not the case, the method is repeated starting from step S1. As will be explained later, the limit value can be a variable parameter 17.

If the measurement condition has been met in step S2, the measured variable 42 is ascertained in step S3. In order to ascertain the measured variable, the ultrasonic transducers 8, 9 are in particular energized intermittently via the driver circuits 12, 13 in order to emit ultrasonic waves into the fluid. The components used to receive the incoming ultrasonic waves, for example analogue-to-digital converters, are not shown in FIG. 1 for reasons of clarity.

In addition, if the measurement condition has been met in step S2, an ascertainment condition is evaluated in step S4, upon the meeting of which the state of charge 1 of the energy storage unit 2 should be ascertained. Evaluating the ascertainment condition makes it possible, for example, for the state of charge to be ascertained not for every ascertainment of the measured variable, but rather only for every fifth or tenth ascertainment, or generally every $n^{th}$ ascertainment, of the measured variable 42. Evaluating the ascertainment conditions in step S4 also makes it possible to ensure that there is only one consumption by particular loads within the ascertainment interval 4, that is to say, for example, there is no transmission of data via a wireless network, no temperature measurement of the fluid and/or no energy-intensive output of information, for example via the notification device 16.

If the ascertainment condition is met in step S4, a plurality of voltage measured values 19 are ascertained via the voltage sensor 15, a plurality of current measured values 20 are ascertained via the current sensor 14 and a plurality of temperature measured values 21 are ascertained via the temperature sensor 18 in step S5 in parallel to the ascertainment of the measured variable 42 explained above. The variables mentioned can in particular each be captured in fixed intervals within the ascertainment interval 4.

Figure 3:
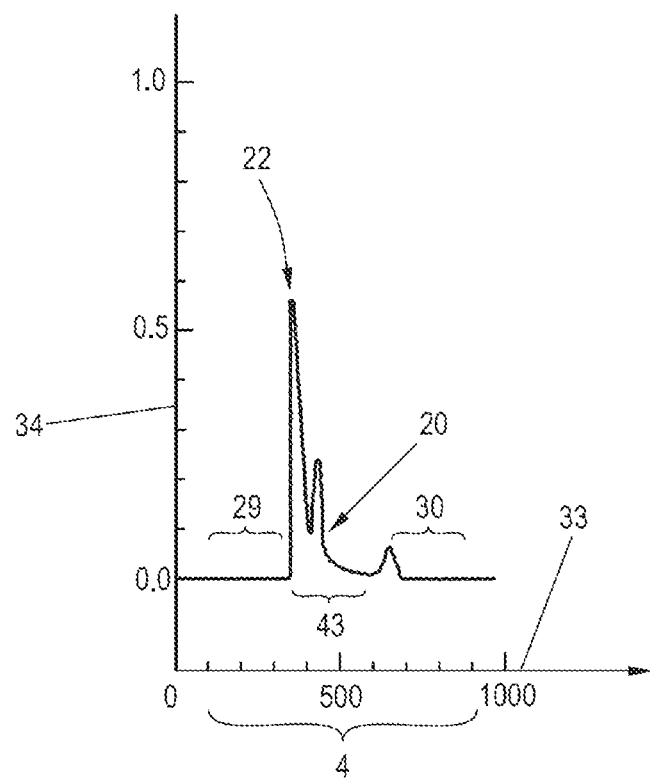
FIG. 3 is a time characteristic diagram of current measured values within an exemplary ascertainment interval in an exemplary embodiment of the method according to the invention.

In this case, FIG. 3 shows the time characteristic of the current or the current measured values 20 in an exemplary ascertainment interval 4, wherein the time in ms is plotted on the x-axis 33 and the current in mA is plotted on the y-axis 34. In the example, the capture interval 4 includes a subinterval 43, during which the ultrasonic transducers 8, 9 are energized, and measurement intervals 29, 30 that are within the capture interval before or after the subinterval 43, and during which in particular the ultrasonic transducers 8, 9 are not energized. Since the processing or control device 11 also controls the energization of the ultrasonic transducers 8, 9, the time of the start and of the end of the energization of the ultrasonic transducers 8, 9, and therefore of the start and of the end of the subinterval 43, are known. The measurement interval 30 can therefore be selected in such a way that it starts and ends at a respectively fixedly predetermined time following the end of the subinterval 43 or of the energization of the ultrasonic transducers 8, 9. Correspondingly, the measurement interval 29 can be selected in such a way that it starts and ends at a respective fixedly predetermined time before the start of the subinterval 43 or therefore of the energization of the ultrasonic transducers 8, 9.

The data captured in step S5 during the ascertainment interval 4 are then processed further in steps S6 to S9 so as to provide the state of charge 1 of the energy storage unit 2 in step S10. To this end, in steps S6 and S8, a total of five input variables are provided that are processed in step S9 by using an algorithm 40 that ascertains the state of charge 1 as an output variable. The different input variables and the relevance thereof for ascertaining the state of charge 1 have already been discussed in detail in the general part, and so the ascertainment thereof is only briefly outlined below.

In step S6, a current maximum value 22 is selected from all of the current measured values 20 captured during the ascertainment interval 4 in order to then process it further as an input variable.

In addition, a measure 23 of the variance of the voltage measured values 19, which were ascertained during the subinterval 43 during which the ultrasonic transducers 8, 9 were energized, is ascertained. The measure 23 can describe the variance or, for example, even the standard deviation and these variables can be ascertained in a conventional manner from the voltage measured values.

In addition, depending on a plurality of the current measured values 20 that were captured following the start of the energization of the ultrasonic transducers 8, 9, that is to say following the start of the subinterval 43, a parameter 24 of a current/time characteristic described by these current measured values 20 is ascertained as an input variable. Suitable parameters 24 have already been discussed in detail in the general part of the description. The time after which the current first falls below a predetermined limit value or the current values that are reached in a fixedly predetermined time interval at the start of the energization can be ascertained as parameters, for example. A mean 25 of the temperatures is formed from the captured temperatures 21 and is taken into consideration as an input variable.

In step S7, a mean 26 of the voltage measured values 19 captured during the measurement interval 30 and a mean 27 of the current measured values 20 captured in the measurement interval 29 are additionally ascertained as an intermediate result. In step S8, the difference 28 between these variables is ascertained as an input variable. Alternatively, the quotient of the means 26, 27 could be used. As has already been discussed in the general part, this difference 28 or this quotient is a good measure of the voltage regeneration, that is to say of how quickly the output voltage of the energy storage unit 2 returns to its initial value again after loading of the energy storage unit 2.

In principle, a relationship with the state of charge 1 could be specified for individual input variables, that is to say, for example, for the current maximum value 22 or the differences 28, in particular depending on the mean 25 of the temperatures 21. However, it has been recognized that the robustness of the ascertainment can be considerably increased if a plurality, in particular all, of the input variables mentioned are taken into consideration. Therefore, in step S9, an algorithm 40 is used that processes all five input variables mentioned so as to provide the state of charge 1 as an output variable in step S10.

As will be explained later with reference to FIG. 5, a plurality of parameters 41 of the algorithm are determined by using a machine learning method, with the result that complex interactions between the different input variables can also be taken into consideration with little computational outlay. By way of example, the algorithm 40 can be implemented as a neural network, wherein the parameters 41 can be input weights of the different neurons, for example. Alternatively, it would also be possible, for example, for the algorithm 40 to define a functional relationship that is parameterized for example by regression analysis and therefore ultimately also by machine learning.

In principle, it is possible to display the state of charge 1 for example via the notification device 16 constantly or following an appropriate operating action by a user, or to transmit that state of charge to an external device. However, in many applications, it is only relevant to issue notification of, or react otherwise to, the state of charge if the state of charge is likely not to be sufficient to operate the measuring device up to the end of a maintenance interval, for example up to a necessary calibration, since the energy storage unit or even the entire measuring device is typically changed following such a maintenance interval in any case.

Therefore, in step S9, a trigger condition 31 is evaluated, upon the meeting of which a notification 32 is output to a user or to a device external to the measuring device in step S12, for example via the notification device 16. Alternatively and/or additionally, a parameter 17 that influences the future operation of the measuring device, in the example the limit value for the time counter and therefore the measuring frequency, could also be changed upon the trigger condition 31 being met.

If the trigger condition 31 has not been met or after the notification 32 has been output or the parameter 17 has been adjusted, the method is repeated starting from step S1.

Figure 4:
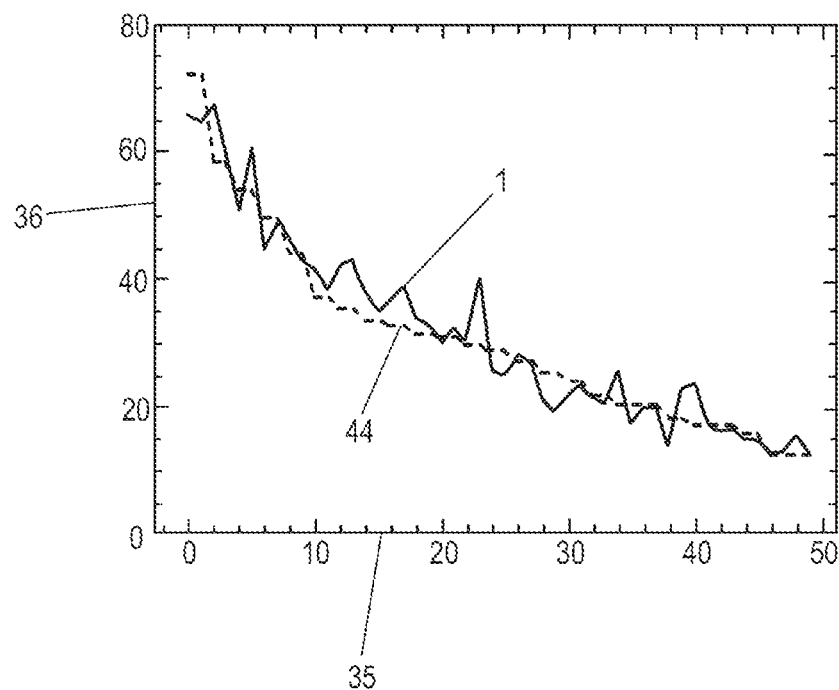
FIG. 4 is a diagram of a comparison between states of charge ascertained by the method according to the invention and actual states of charge of an energy storage unit.

By way of example, FIG. 4 shows a comparison between respective states of charge 1, which have been ascertained by way of the method described and depicted as an interpolated solid line for clear illustration, and the states of charge, which have been actually ascertained and depicted as a dashed line. In this case, the x-axis 35 shows the consecutive number of the respective ascertainment interval, and therefore indirectly an operating time of the measuring device 3, and the y-axis 36 shows the state of charge in percent.

As is evident from this graph, the characteristic of the actual state of charge 44 is well approximated by the ascertained states of charge 1. The main difference is noticeably greater noise of the ascertained states of charge 1, which can, however, be largely suppressed by ascertaining the mean or the median for a plurality of successive ascertainment intervals 4, for example.

Figure 5:
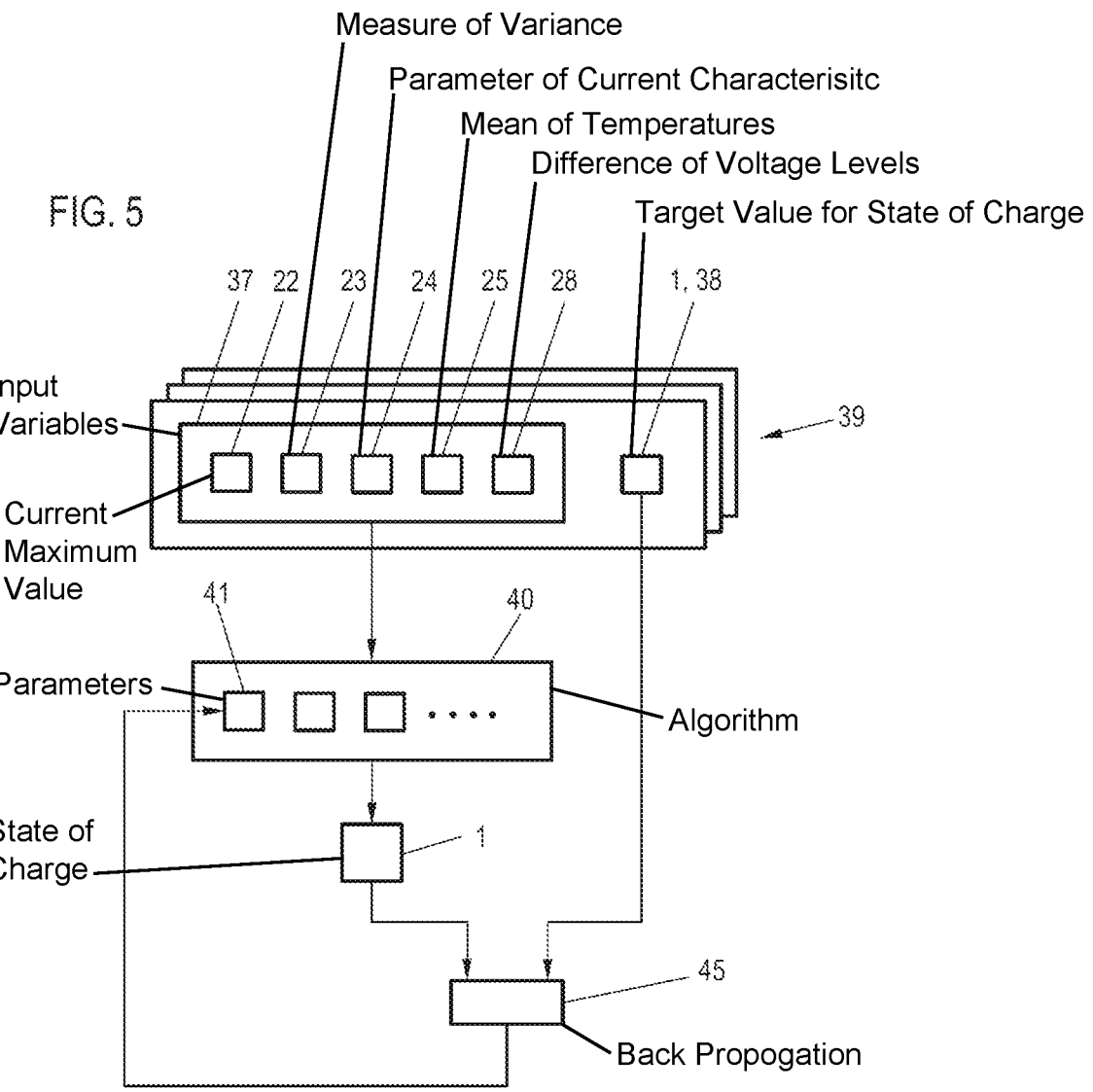
FIG. 5 is a block diagram showing a determination of parameters of the algorithm used in FIG. 1 for ascertaining the state of charge by using a machine learning method.

FIG. 5 schematically shows an approach for determining the parameters 41 of the algorithm 40 used in FIG. 2. As has already been explained in detail in the general part, it is retrospectively possible to ascertain an actual state of charge of the energy storage unit with a high level of accuracy, with the result that reference data 39, for example training datasets, can be provided with little technical outlay, which, for a respective ascertainment interval, include the ascertained input variables 37, in the example according to FIG. 2 the current maximum value 22, the measure 23 of the variance, the parameter 24 of the current characteristic, the mean 25 of the temperatures and the differences 28 of the voltage levels in the measurement intervals 30, 31, on the hand, and a target value 38 for the state of charge 1, on the other hand.

The algorithm 40 can first of all be parameterized in accordance with initial values or, for example, randomly, after which the algorithm 40 thus parameterized can be applied to the input variables 37 of the respective reference data 39 so as to ascertain a provisional value for the state of charge 1. As part of a back propagation 45, that value can be compared with the target value 38 in order to adjust the parameters 41 of the algorithm 40.

Corresponding approaches for back propagation are known in principle and shall not be explained in detail. By way of example, when using an algorithm 40 that is differentiable with regard to the parameters 41, it is possible to determine a direction of change of the parameters 41 for minimizing an error or a cost function.

The following is a summary list of reference numerals and the corresponding structure used in the above description of the invention.

LIST OF REFERENCE SIGNS

1 State of charge
2 Energy storage unit
3 Measuring device
4 Ascertainment interval
5 Measuring tube
6 Measurement volume
7 Control device
8 Ultrasonic transducer
9 Ultrasonic transducer
10 Ultrasonic wave
11 Processing device
12 Driver circuit
13 Driver circuit
14 Current sensor
15 Voltage sensor
16 Notification device
17 Parameter
18 Temperature sensor
19 Voltage measured values
20 Current measured values
21 Temperature
22 Current maximum value
23 Measure
24 Parameter
25 Mean
26 Mean
27 Mean
28 Difference
29 Measurement interval
30 Measurement interval
31 Trigger condition
32 Notification
33 x-axis
34 y-axis
35 x-axis
36 y-axis
37 Input variables
38 Target value
39 Reference data
40 Algorithm
41 Parameter
42 Measured variable
43 Subinterval
44 State of charge
45 Backpropagation

The invention claimed is:

1. A method for ascertaining at least one of a state of charge of an energy storage unit of a measuring device or a probable remaining operating time of the measuring device, the method comprising:
    capturing, within a respective ascertainment interval, a plurality of voltage measured values for a voltage dropped across the energy storage unit and a plurality of current measured values for a current provided by the energy storage unit;

subsequently ascertaining at least one of the state of charge associated with the respective ascertainment interval or the remaining running time associated with the ascertainment interval, depending on the plurality of voltage measured values and current measured values;

ascertaining a width of a current maximum as a time interval between a current limit value being exceeded and the current limit value or a further current limit value falling below the current measured values captured during the respective ascertainment interval, and ascertaining at least one of the state of charge or the remaining running time in dependence on the width of the current maximum; and ascertaining a measure of a variance of the voltage measured values captured during the respective ascertainment interval or a subinterval of the respective ascertainment interval, and ascertaining at least one of the state of charge or the remaining running time in dependence on the measure of the variance.

2. The method according to claim 1, which further comprises:
providing components of the measuring device, the components including the energy storage unit;
capturing a temperature of the energy storage unit or of at least one other component of the measuring device; and
additionally carrying out the ascertainment of at least one of the state of charge or the remaining running time in dependence on the temperature.

3. The method according to claim 1, which further comprises selecting or ascertaining a current maximum value from the current measured values captured during the respective ascertainment interval, and ascertaining at least one of the state of charge or the remaining running time in dependence on the current maximum value.

4. The method according to claim 1, which further comprises at least one of energizing a particular load or an ultrasonic transducer of the measuring device or carrying out a radio transmission by using a communication device of the measuring device, at least or exclusively during the subinterval of the ascertainment interval.

5. The method according to claim 4, which further comprises capturing at least one of the voltage measured values during a measurement interval within the capture interval starting and ending at a respective fixedly predetermined time following an end of the energization of the particular load or an end of the radio transmission, and ascertaining at least one of the state of charge or the remaining running time in dependence on a mean or a median of the voltage values captured in the measurement interval.

6. The method according to claim 4, which further comprises capturing at least one of the voltage measured values during a further measurement interval within the capture interval starting and ending at a respective fixedly predetermined time before a start of the energization of the particular load or before a start of the radio transmission, and ascertaining at least one of the state of charge or the remaining running time in dependence on a mean or a median of the voltage measured values captured in the further measurement interval.

7. The method according to claim 4, which further comprises, depending on a plurality of the current measured values captured following a start of the energization of the particular load or a start of the radio transmission, ascertaining a parameter of a current/time characteristic described by the current measured values, and ascertaining at least one of the state of charge or the remaining running time in dependence on the parameter of the current/time characteristic.

8. The method according to claim 1, which further comprises ascertaining at least one of the state of charge or the remaining running time by using an algorithm with a plurality of parameters being or having been predetermined by machine learning based on reference data.

9. The method according to claim 1, which further comprises at least one of:
selecting the ascertainment interval to be shorter than 10 seconds, or
carrying out exactly one determination of a measured variable or a flow rate determination within the ascertainment interval, or
setting a spacing between two ascertainment intervals to be at least double a length of a respective ascertainment interval.

10. The method according to claim 9, which further comprises selecting the ascertainment interval to be shorter than 5 seconds.

11. The method according to claim 1, which further comprises, upon meeting a trigger condition depending on at least one of the state of charge or the remaining running time, at least one of:
actuating a notification device of the measuring device to output a notification to at least one of a user or a device external to the measuring device, or
changing at least one parameter influencing future operation of the measuring device.

12. A measuring device for capturing a measured variable relating to at least one of a fluid received in a measurement volume or a fluid guided through the measurement volume or a flow of the fluid, the measuring device comprising:
a processing device and an energy storage unit;
said processing device configured to ascertain at least one of the state of charge of the energy storage unit or a probable remaining operating time of the measuring device according to the method of claim 1.

* * * * *